(12) United States Patent
Kitahama (10) Patent No.: US 9,941,446 B2
(45) Date of Patent: Apr. 10, 2018

(54) LIGHT-EMITTING ELEMENT WITH FIRST AND SECOND LIGHT TRANSMISSIVE ELECTRODES AND METHOD OF MANUFACTURING THE SAME

(71) Applicant: NICHIA CORPORATION, Anan-shi, Tokushima (JP)

(72) Inventor: Shun Kitahama, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 15/388,444

(22) Filed: Dec. 22, 2016

(65) Prior Publication Data

US 2017/0186914 A1 Jun. 29, 2017

(30) Foreign Application Priority Data

Dec. 24, 2015 (JP) .................................. 2015-250843

(51) Int. Cl.
*H01L 33/38* (2010.01)
*H01L 33/44* (2010.01)
(Continued)

(52) U.S. Cl.
CPC ............ *H01L 33/38* (2013.01); *H01L 33/387* (2013.01); *H01L 33/40* (2013.01); *H01L 33/44* (2013.01);
(Continued)

(58) Field of Classification Search
None
See application file for complete search history.

(56) References Cited

U.S. PATENT DOCUMENTS

2012/0018765 A1* 1/2012 Mizogami ............... H01L 33/42
257/99
2012/0098009 A1 4/2012 Kim et al.
2017/0062676 A1* 3/2017 Kondo .................. H01L 33/507

FOREIGN PATENT DOCUMENTS

JP 2008-135554 A 6/2008
JP 2008300719 A * 12/2008
(Continued)

OTHER PUBLICATIONS

Gong, Y. "Photonic Crystal Cavities in Silicon Dioxide" Appl. Phys. Lett. 96 published online Jan. 2010 pp. 031107-1 through 031107-3.*

(Continued)

*Primary Examiner* — Asok K Sarkar
*Assistant Examiner* — Grant Withers
(74) *Attorney, Agent, or Firm* — Foley & Lardner LLP (57) ABSTRACT

A method of manufacturing a light-emitting element includes forming a light-transmissive insulating film on a portion of an upper surface of a semiconductor layered body; forming a first light-transmissive electrode to continuously cover the upper surface of the semiconductor layered body and an upper surface of the light-transmissive insulating film; heat-treating the first light-transmissive electrode, and subsequently forming a metal film in at least a portion of a region above the light-transmissive insulating film; forming a second light-transmissive electrode to continuously cover an upper surface of the metal film and an upper surface of the first light-transmissive electrode, the second light-transmissive electrode being electrically connected to the first light-transmissive electrode; and forming a pad electrode in a region where the metal film is disposed in a top view, such that at least a portion of the pad electrode is in (Continued)

contact with an upper surface of the second light-transmissive electrode.

24 Claims, 8 Drawing Sheets

(51) Int. Cl.
    *H01L 33/40*     (2010.01)
    *H01L 33/42*     (2010.01)

(52) U.S. Cl.
    CPC ............ *H01L 33/405* (2013.01); *H01L 33/42* (2013.01); *H01L 2933/0016* (2013.01)

(56) References Cited

FOREIGN PATENT DOCUMENTS

| | | |
|---|---|---|
| JP | 2011-138820 A | 7/2011 |
| JP | 2012-019153 A | 1/2012 |
| JP | 2012-124321 A | 6/2012 |
| JP | 2012-138465 A | 7/2012 |
| JP | 2013-058608 A | 3/2013 |

OTHER PUBLICATIONS

English machine translation of JP 2008300719 A dated Dec. 11, 2012.*

English machine translation of JP 2013058608 A dated Mar. 28, 2013.*

\* cited by examiner

LIGHT-EMITTING ELEMENT WITH FIRST AND SECOND LIGHT TRANSMISSIVE ELECTRODES AND METHOD OF MANUFACTURING THE SAME

CROSS REFERENCE TO RELATED APPLICATION

This application claims priority to Japanese Patent Application No. 2015-250843 filed on Dec. 24, 2015, The entire disclosure of Japanese Patent Application No. 2015-250843 is hereby incorporated herein by reference.

BACKGROUND

1. Field of the Invention

The present invention relates to a light-emitting element and a method for manufacturing the same.

2. Description of Related Art

Known examples of light-emitting elements include a light emitting element including a light-transmissive electrode made of indium tin oxide (ITO) on approximately the entire surface of p-side semiconductor layer, a p-pad electrode made of metal on a portion of the light-transmissive electrodes, and an insulating film disposed in a region directly below the p-pad electrode. In such a light-emitting element, providing the insulating films allows for reducing light emission in the region directly below the p-pad electrodes, so that the amount of light absorbed by the p-pad electrodes can be reduced. However, in such a light emitting element, a part of light emitted from a region surrounding the region directly below the p-pad electrode may pass through the insulating films and may be absorbed by the p-pad electrodes. To reduce the light absorption, in Japanese Unexamined Patent Application Publication No. 2012-124321, a structure in which metal reflective films are disposed above the insulating films is proposed. With the metal reflective film between the insulating film and the light-transmissive electrode, light absorption by the p-pad electrode can be reduced.

SUMMARY

In Japanese Unexamined Patent Application Publication No. 2012-124321, heat treatment may be performed after forming the light-transmissive electrodes in order to improve ohmic contact with the p-side semiconductor layers and light transmittance in the electrode structure. This heat treatment, however, tends to cause a decrease in light reflectance of the metal reflective films. Accordingly, light extraction efficiency of the light-emitting elements has room for further improvement. One object of certain embodiments of the present invention is to provide a light-emitting element with improved light extraction efficiency, and a method of manufacturing the same.

A method for manufacturing a light-emitting element according to one embodiment of the present invention includes forming a light-transmissive insulating film on a portion of an upper surface of a semiconductor layered body, forming a first light-transmissive electrode to continuously cover an upper surface of the semiconductor layered body and an upper surface of the light-transmissive insulating film, heat-treating the first light-transmissive electrode, and subsequently forming a metal film in at least a portion of a region above the light-transmissive insulating film, forming a second light-transmissive electrode to continuously cover an upper surface of the metal film and an upper surface of the first light-transmissive electrode, the second light-transmissive electrode being electrically connected to the first light-transmissive electrode, and forming a pad electrode in a region where the metal film is disposed in a top view, such that at least a portion of the p-pad electrode is in contact with an upper surface of the second light-transmissive electrode.

A light-emitting element according to an embodiment of the present invention includes a semiconductor layered body, a light-transmissive insulating film on a portion of an upper surface of the semiconductor layered body, a metal film in at least a portion of a region above the light-transmissive insulating film, a first light-transmissive electrode continuously covering the upper surface of the semiconductor layered body and an upper surface of the light-transmissive insulating film, a second light-transmissive electrode continuously covering an upper surface of the metal film and an upper surface of the first light-transmissive electrode and electrically connected to the first light-transmissive electrode, and a pad electrode disposed in a region where the metal film is disposed in a top view, such that at least a portion of the pad electrode is in contact with an upper surface of the second light-transmissive electrode.

With the method of manufacturing a light-emitting element according to an embodiment of the present invention, a light-emitting element with improved light extraction efficiency can be manufactured.

Further, in a light-emitting element according to an embodiment of the present invention, light extraction efficiency can be improved.

DETAILED DESCRIPTION OF EMBODIMENTS

In the description below, a light-emitting element according to certain embodiments of the present invention and a method of manufacturing the same will be described.

The drawings referred to in the descriptions below schematically illustrate certain embodiments of the present invention. The scales, the distances, the positional relations, and the like of members may be exaggerated, or illustration of a part of a member may be omitted in some cases. Also, the scales or the distances of the members in a plan view may not correspond the scales or the distances in a cross-sectional view. In the descriptions below, the same term or reference number represents the same or like member, and its detailed description will be omitted as appropriate.

In the present specification, "the upper side" or "above" indicates a side of a semiconductor layered body where both an n-electrode and a p-electrode are disposed and light is extracted, and "the lower side" or "below" indicates the opposite side of a semiconductor layered body.

First Embodiment

Structure of Light-Emitting Element

In the description below, a light-emitting element 1 according to first embodiment of the present invention is illustrated referring to FIG. 1A to FIG. 2C.

Figure 1A:
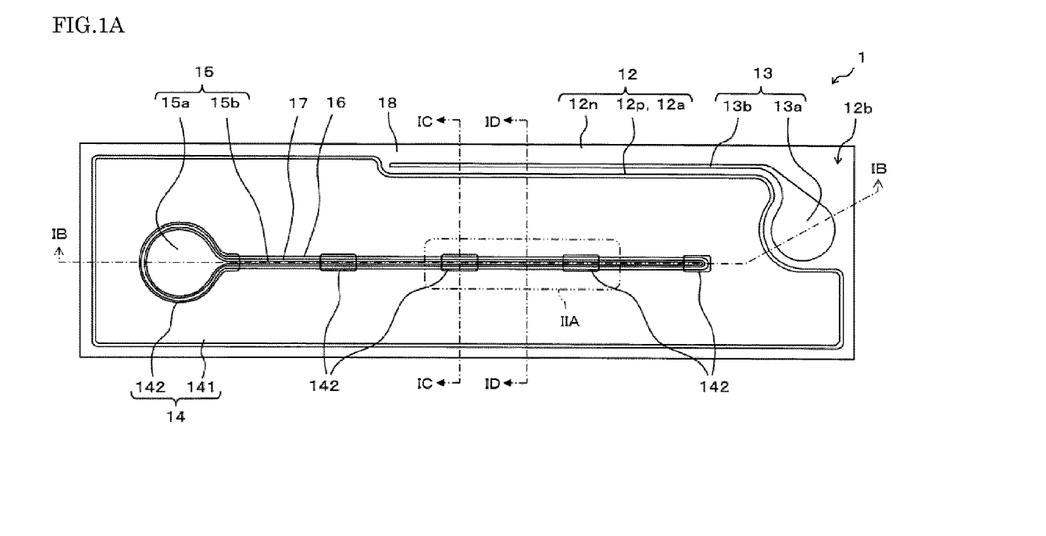
FIG. 1A is a schematic plan view showing a structure of a light-emitting element according to a first embodiment.
Figure 1B:
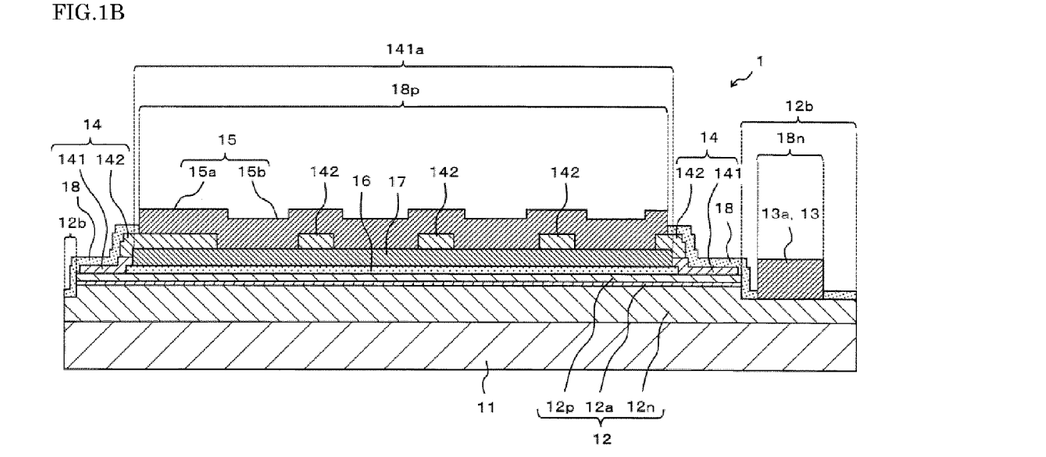
FIG. 1B is a schematic cross-sectional view showing the structure of the light-emitting element according to the first embodiment taken along the line IB-IB in FIG. 1A.
Figure 1C:
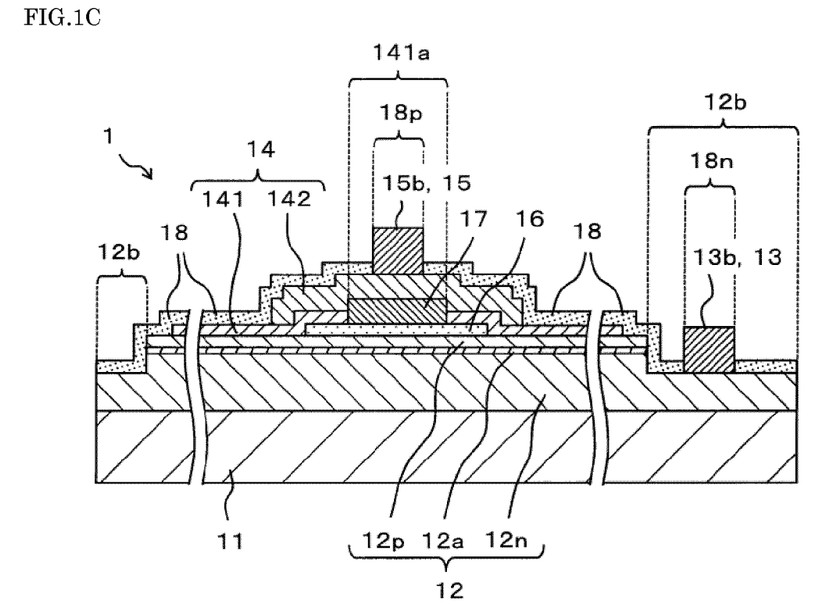
FIG. 1C is a schematic cross-sectional view showing the structure of the light-emitting element according to the first embodiment taken along the line IC-IC in FIG. 1A.
Figure 1D:
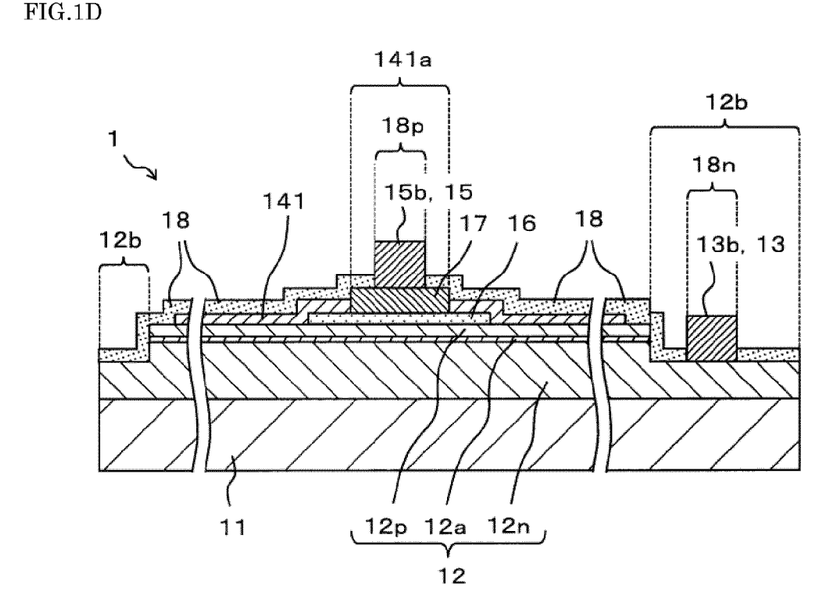
FIG. 1D is a schematic cross-sectional view showing the structure of the light-emitting element according to the first embodiment taken along the line ID-ID in FIG. 1A.
Figure 2A:
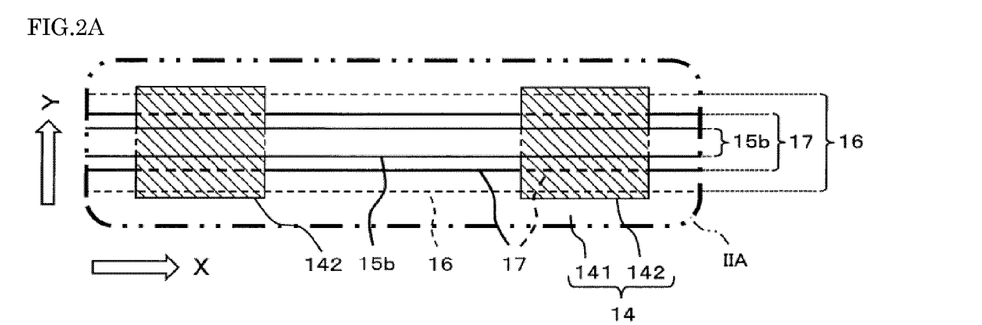
FIG. 2A is a schematic plan view showing an arrangement of a second light-transmissive electrode in the light-emitting element according to the first embodiment, and is an enlarged view of the area IIA indicated by the dash-dot-dot lines in FIG. 1A.
Figure 2B:
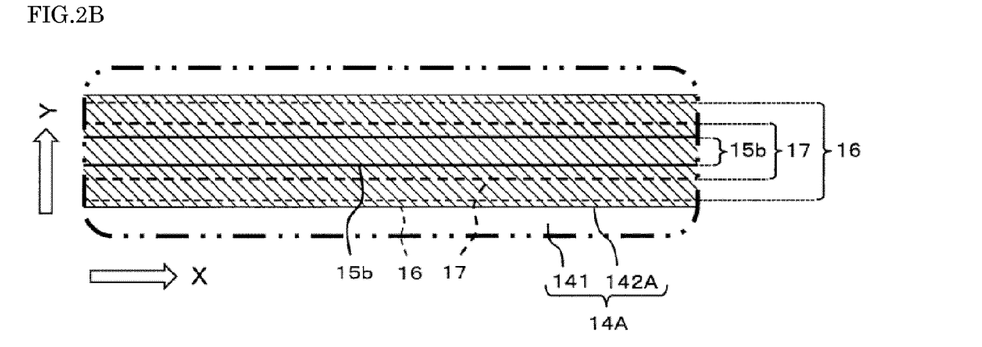
FIG. 2B is a schematic plan view showing an arrangement of a second light-transmissive electrode in a light-emitting element according to a first modification of the first embodiment, and is an enlarged view corresponding to the area IIA in FIG. 1A.
Figure 2C:
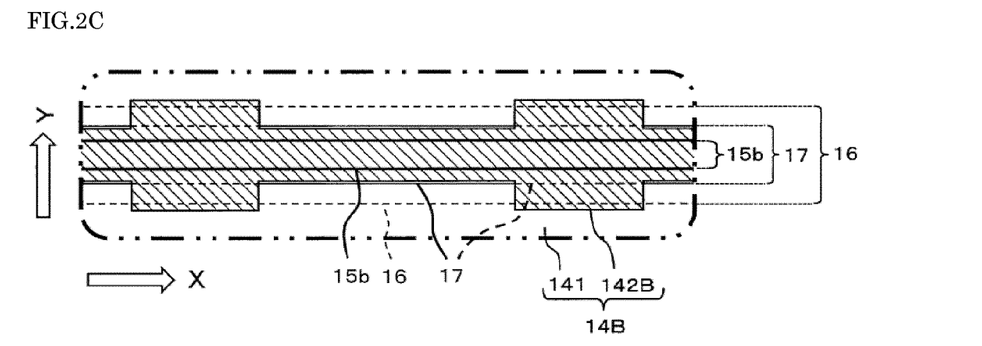
FIG. 2C is a schematic plan view showing an arrangement of a second light-transmissive electrode in a light-emitting element according to a second modification of the first embodiment, and is an enlarged view corresponding to the area IIA in FIG. 1A.

The cross-sectional views in FIG. 1C and FIG. 1D each shows cross-sections of a region in which a p-side extending portion 15b of a p-pad electrode 15 is disposed, a region near that area, and regions near outer edges of the light-emitting element 1 in FIG. 1A. Illustration of regions between these regions is omitted, as indicated by break lines. The same applies to FIG. 4A to FIG. 5 to be described below. In FIG. 2A to FIG. 2C, a hatched region indicates a region in which a second light-transmissive member is disposed in a top view, but does not indicate a cross-section.

As shown in FIG. 1A, the outer edges of the light-emitting element 1 has a substantially rectangular peripheral shape in a top view. The light-emitting element 1 includes a semiconductor layered body 12, an n-electrode 13, a light-transmissive electrode 14, a p-pad electrode 15, a light-transmissive insulating film 16, a metal film 17, and a protective film 18. More specifically, as shown in FIG. 1B, the light-emitting element 1 includes a substrate 11, the semiconductor layered body 12 layered on an upper surface of the substrate 11, the light-transmissive insulating film 16 disposed on a portion of an upper surface of the semiconductor layered body 12, the metal film 17 disposed in at least a portion of a region above the light-transmissive insulating film 16, a first light-transmissive electrode 141 continuously covering the upper surface of the semiconductor layered body 12 and an upper surface of the light-transmissive insulating film 16, a second light-transmissive electrode 142 continuously covering an upper surface of the metal film 17 and an upper surface of the first light-transmissive electrode 141 and electrically connected to the first light-transmissive electrode 141, and the p-pad electrode 15 disposed in a region in which the metal film 17 is disposed in a top view so that at least a portion of the p-pad electrode 15 is in contact with an upper surface of the second light-transmissive electrode 142.

Substrate

The substrate 11 supports the semiconductor layered body 12. The substrate 11 may be a growth substrate for epitaxially growing the semiconductor layered body 12. For the substrate 11, for example, a sapphire ($Al_2O_3$) substrate can be used in the case where a nitride semiconductor is used for the semiconductor layered body 12.

Semiconductor Layered Body

The semiconductor layered body 12 includes an n-side semiconductor layer 12n and a p-side semiconductor layer 12p that are layered in this order on the upper surface of the substrate 11, which is one of main surfaces of the substrate 11. It is preferable to dispose an active layer 12a between the n-side semiconductor layer 12n and the p-side semiconductor layer 12p as shown in FIG. 1B to FIG. 1D.

The semiconductor layered body 12 includes a region in which the p-side semiconductor layer 12p and the active layer 12a are partially absent, that is, a region recessed from a surface of the p-side semiconductor layer 12p and in which the n-side semiconductor layer 12n is exposed at an upper side from the p-side semiconductor layer 12p. This region is referred to as an "exposed portion 12b."

In the semiconductor layered body 12, the exposed portion 12b is disposed along a periphery of the light-emitting element 1 in a top view. As shown in FIG. 1A, the exposed portion 12b is disposed in a region along the short sides and the long sides of the light-emitting element 1 in a top view. The n-electrode 13 is disposed in this area in which the exposed portion 12b is disposed.

For example, a nitride semiconductor such as $In_XAl_YGa_{1-X-Y}N$ ($0 \leq X$, $0 \leq Y$, $X+Y<1$) is used for the n-side semiconductor layer 12n, the active layer 12a, and the p-side semiconductor layer 12p.

N-Electrode

The n-electrode 13 is a pad electrode on a negative electrode side used to supply electric current from the outside to the light-emitting element 1. The n-electrode 13 is disposed on an upper surface of the n-side semiconductor layer 12n, which is an upper surface of the exposed portion 12b of the semiconductor layered body 12, and is electrically connected to the semiconductor layered body 12. For the n-electrode 13, for example, Cu, Au, or an alloy containing these metals as a main component can be used to facilitate connection to external members using wire bonding or the like. Alternatively, the n-electrode 13 may have a multi-layered structure in which a light-reflective layer made of, Al, Ag, etc., is disposed on a lower layer side.

As shown in FIG. 1A, the n-electrode 13 includes, in a top view, an approximately circular n-side external connection portion 13a near a short side of the light-emitting element 1 and an n-side extending portion 13b extending from the n-side external connection portion 13a along a long side of the light-emitting element 1. The n-side external connection portion 13a is a region used to connect the element to external members. The n-side extending portion 13b is an auxiliary electrode for efficiently diffusing the electric current supplied through the n-side external connection portion 13a into the n-side semiconductor layer 12n.

In the n-electrode 13, the n-side external connection portion 13a and the n-side extending portion 13b of the n-electrode 13 are made of the same material.

Electrode Structure on P-Side Semiconductor Layer

In the light-emitting element 1, an electrode structure on the p-side semiconductor layer 12p (hereinafter simply referred to as a "p-side electrode structure") includes the light-transmissive electrode 14, the p-pad electrode 15, the light-transmissive insulating film 16, and the metal film 17. The light-transmissive electrode 14 includes the first light-transmissive electrode 141 and the second light-transmissive electrode 142. The p-side electrode structure will be described in order from the lower layer side.

Light-Transmissive Insulating Film

The light-transmissive insulating film 16 is disposed in an region above the p-side semiconductor layer 12p at a region directly below the p-pad electrode 15 and a region near the region, that is, in a top view, in a region including a region in which the p-pad electrode 15 is disposed. Further, the light-transmissive insulating film 16 is disposed between the p-side semiconductor layer 12p and the first light-transmissive electrode 141. With this arrangement, electric current not easily flows through the region directly below the p-pad electrode 15, and accordingly light emission from this region can be reduced. The amount of light absorbed by the p-pad electrode 15 can be thus reduced. In addition, this arrangement can increase the electric current flowing through a region near the region directly below the light-transmissive insulating film 16, so that light can be efficiently emitted from the light-emitting element 1.

The light-transmissive insulating film 16 preferably has a refractive index smaller than the refractive index of the p-side semiconductor layer 12p and greatly different from the refractive index of the p-side semiconductor layer 12p. With this arrangement, according to the difference in refractive indices and Snell's law, light propagating upward in the semiconductor layered body 12 can be effectively reflected at the interface between the p-side semiconductor layer 12p and the light-transmissive insulating film 16. Accordingly, light absorption by the p-pad electrode 15 can be further reduced.

For example, $SiO_2$, which has a small refractive index and superior light transmittance, can be used for the light-transmissive insulating film 16.

First Light-Transmissive Electrode

The first light-transmissive electrode 141 functions as an ohmic electrode and is disposed on the upper surface of the p-side semiconductor layer 12p in a region except for the region near the periphery. At a portion below which the light-transmissive insulating film 16 is disposed, the first light-transmissive electrode 141 is disposed on the p-side semiconductor layer 12p via the light-transmissive insulating film 16. The first light-transmissive electrode 141 has an opening 141a at a portion above the light-transmissive insulating film 16.

The first light-transmissive electrode 141 is configured to diffuse electric current supplied through the p-pad electrode 15 and the second light-transmissive electrode 142 and then supply the electric current to the p-side semiconductor layer 12p. The light-transmissive insulating film 16 is disposed, however, in the region directly below the p-pad electrode 15 and the region near this area, so that electric current is not easily flown through these regions.

The light-transmissive electrode 14 is made of an electrically-conductive metal oxide. Examples of such electrically-conductive metal oxide include oxides containing at least one element selected from the group consisting of Zn, In, Sn, Ga, and Ti. For example, ITO and ZnO each has high transmissivity with respect to visible light and high electrical conductivity, so that these materials are preferable for covering substantially the entire upper surface above the p-side semiconductor layer 12p.

The first light-transmissive electrode 141 is preferably thick in view of electric current diffusion, while is preferably thin in view of light extraction, that is, light transmissivity. The first light-transmissive electrode 141 has a thickness of, for example, in the case where ITO is used for the first light-transmissive electrode 141, about 40 nm to 100 nm, preferably about 50 nm to 80 nm.

Metal Film

In the opening 141a of the first light-transmissive electrode 141, the metal film 17 is disposed so as to be in contact with the upper surface of the light-transmissive insulating film 16. The metal film 17 is a light-reflective film that serves to reflect light that has not been reflected by the interface between the p-side semiconductor layer 12p and the light-transmissive insulating film 16 and has propagated upward in the light-transmissive insulating film 16 and to allow the light to return to the semiconductor layered body 12 side. The metal film 17 is disposed in the region directly below the p-pad electrode 15 and its periphery, so as to include a portion on which the p-pad electrode 15 is disposed in a top view. In other words, the metal film 17 is slightly larger than the p-pad electrode 15 in a top view.

Instead of forming the opening 141a in the first light-transmissive electrode 141, the metal film 17 can be disposed above the p-side semiconductor layer 12p via the first light-transmissive electrode 141. However, with the opening 141a in the first light-transmissive electrode 141 and the metal film 17 disposed to be in contact with the upper surface of the light-transmissive insulating film 16, light absorption by the first light-transmissive electrode 141 can be reduced, and light propagated in the light-transmissive insulating film 16 and incident on the lower surface of the metal film 17 can be efficiently reflected. Accordingly, light extraction efficiency of the light-emitting element 1 can be further improved.

The metal film 17 is disposed to be in contact with a periphery of the opening 141a of the first light-transmissive electrode 141. However, the metal film 17 may instead be separated from the periphery of the opening 141a or may extend to the upper surface of the first light-transmissive electrode 141.

The metal film 17 has a reflectance higher than at least the reflectance of a lower surface of the p-pad electrode 15 with respect to wavelength of light emitted by the semiconductor layered body 12. Examples of the metal film 17 include Al, Ru, Ag, Ti, Ni, and alloys containing any of these metals as main components. Among these, Al, Ag, or an alloy containing any of these metals as a main component is more preferable.

Second Light-Transmissive Electrode

As shown in FIG. 1A to FIG. 1C and FIG. 2A, the second light-transmissive electrode 142 is disposed intermittently along the elongated direction of the p-pad electrode 15 so that the second light-transmissive electrode 142 continuously cover the upper surface of the metal film 17 and the upper surface of the first light-transmissive electrode 141 and so that an end portion of the second light-transmissive electrode 142 is in contact with the upper surface of the first light-transmissive electrode 141. The second light-transmissive electrode 142 serves as a current path that allows electric current supplied through the p-pad electrode 15 on the upper surface of the second light-transmissive electrode 142 to be conducted to the first light-transmissive electrode 141.

While the second light-transmissive electrode 142 is connected to the metal film 17, contact resistance between ITO or the like, which is preferable for the second light-transmissive electrode 142, and Al or the like, which is preferable for the metal film 17, is large. For this reason, the metal film 17 substantially does not function as a current path between the p-pad electrode 15 and the first light-transmissive electrode 141.

In the case where the metal film 17 is disposed below the first light-transmissive electrode 141, due to heat-treatment for allowing the first light-transmissive electrode 141 to have ohmic contact with the p-side semiconductor layer 12p, the metal film 17 may be deteriorated or detached, so that function of the metal film 17 as a light-reflective film may be deteriorated. For this reason, in the present embodiment, the metal film 17 is disposed after the first light-transmissive electrode 141 is formed, which allows the metal film 17 not to be affected by the heat-treatment performed in a step of forming the first light-transmissive electrode 141 to be described below.

For the second light-transmissive electrode 142, a material similar to the material of the first light-transmissive electrode 141 as described above can be used, and preferably the same material as the material of the first light-transmissive electrode 141 is used. With this arrangement, the contact resistance between the first light-transmissive electrode 141 and the second light-transmissive electrode 142 can be small. Accordingly, by forming the second light-transmissive electrode 142 by sputtering or the like and bringing a portion of the second light-transmissive electrode 142 in contact with the first light-transmissive electrode 141, these electrodes can be electrically connected to each other. In this case, with the small contact resistance between the first light-transmissive electrode 141 and the second light-transmissive electrode 142, in a step of forming the second light-transmissive electrode 142 to be described later, heat-treatment to reduce the contact resistance between these electrodes can be omitted. Accordingly, the metal film 17 formed below the second light-transmissive electrode 142 is also not subjected to heat-treatment. Thus, deterioration or detachment of the metal film 17 due to heat-treatment may not occur.

In order to reduce the electrical resistance in the current path between the p-pad electrode 15 and the first light-transmissive electrode 141, it is preferable that the second light-transmissive electrode 142 has a great thickness. In the case where the second light-transmissive electrode 142 is formed on the metal film 17, the thickness of the second light-transmissive electrode 142 tends to be reduced on the outer periphery due to the thickness of the metal film 17. In this case, the electrical resistance of the second light-transmissive electrode 142 on the outer periphery of the metal film 17 may be increased, and the second light-transmissive electrode 142 may be damaged. Such a problem is likely to occur particularly in the case where the contact resistance between the second light-transmissive electrode 142 and the metal film 17 is large. For this reason, increasing the second light-transmissive electrode 142 allows for reducing electrical resistance in the current path between the p-pad electrode 15 and the first light-transmissive electrode 141 and preventing the second light-transmissive electrode 142 from being damaged.

Accordingly, the second light-transmissive electrode 142 preferably has a thickness larger than the first light-transmissive electrode 141. For example, in the case where ITO is used, the thickness of the second light-transmissive electrode 142 can be about 120 nm to 300 nm, preferably about 140 nm to 200 nm.

The second light-transmissive electrode 142 tends to have less light-transmissivity than the first light-transmissive electrode 141 because the second light-transmissive electrode 142 is not subjected to heat-treatment at the step of forming the second light-transmissive electrode 142 to be described later. For this reason, the larger the area of the second light-transmissive electrode 142 disposed in the light extraction path on the upper side of the light-emitting element 1 is, the more easily the light extraction efficiency is decreased.

In view of this, as shown in FIG. 2A, the second light-transmissive electrode 142 is intermittently formed along the extending direction of the metal film 17 in a top view. Further, in a top view, the second light-transmissive electrode is continuously disposed in the region where the metal film 17 is disposed and its adjacent region where the first light-transmissive electrode 141 is disposed, adjacent to that area in a top view. In other words, with the second light-transmissive electrode 142 intermittently disposed along the extending direction of the p-pad electrode 15, that is, the extending direction of the metal film 17, the area for disposing the second light-transmissive electrode 142 can be reduced. Such a configuration allows for reducing absorption of light by the second light-transmissive electrode 142 and thus can improve the light extraction efficiency of the light-emitting element 1. Further, the region adjacent to the region where the metal film 17 is disposed, in which the first light-transmissive electrode 141 is electrically connected to the second light-transmissive electrode 142, is disposed intermittently along the extending direction of the p-pad electrode 15. With this arrangement, the electric current supplied to a p-side external connection portion 15a, which is an external connection portion of the p-pad electrode 15, can be dispersed along the p-side extending portion 15b, which is an extending portion of the p-pad electrode 15. Accordingly, the electric current can be thus efficiently diffused into the p-side semiconductor layer 12p.

Variations of Second Light-Transmissive Electrode

As shown in FIG. 2A, the second light-transmissive electrode 142 is preferably disposed intermittently in the extending direction of the metal film 17. However, as shown in FIG. 2B, a second light-transmissive electrode 142A may be continuously disposed. Alternatively, as shown in FIG. 2C, a second light-transmissive electrode 142B may be disposed continuously in the region where the metal film 17 is disposed, and intermittently in its adjacent region.

P-Pad Electrode

The p-pad electrode 15 is a positive-electrode side pad electrode for supplying electric current from the outside to the light-emitting element 1. As shown in FIG. 1A, in a top view, the p-pad electrode 15 includes a substantially circular p-side external connection portion 15a disposed on an upper side of the light-emitting element 1 and the p-side extending portion 15b that is substantially parallel to a long periphery of the light-emitting element 1 and extends from the p-side external connection portion 15a toward the n-side external connection portion 13a. The p-side external connection portion 15a is a region for connecting the light-emitting element to the outside. The p-side extending portion 15b is an auxiliary electrode for efficiently diffusing electric current, which is supplied through the p-side external connection portion 15a, into the light-transmissive electrode 14.

As shown in FIG. 1A and FIG. 1B, the p-pad electrode 15 continuously covers the upper surface of the second light-transmissive electrode 142, which is intermittently disposed, and a portion of the upper surface of the metal film 17 between the second light-transmissive electrode 142.

As described above, the p-pad electrode 15 is disposed within the region in which the metal film 17 is disposed in a top view (see FIG. 1A). In other words, the p-pad electrode 15 is arranged so that the light from the light-emitting element 1 is not directed toward the p-pad electrode 15. This arrangement allows for reducing absorption of light by the p-pad electrode 15 and preventing decrease in light extraction efficiency.

In the case where the p-pad electrode 15 is merely electrically connected to the p-side semiconductor layer 12p, without forming the second light-transmissive electrode 142, in a top view, the p-pad electrode 15 can be formed to be extended to an outside of the metal film 17 so that the p-pad electrode 15 is in contact with the first light-transmissive electrode 141 at an outside of the metal film 17. In such a configuration, however, a region in which the metal film 17 is not disposed is present directly below the p-pad electrode 15, so that absorption of light by the p-pad electrode 15 cannot be sufficiently reduced. In view of this, in the present embodiment, the second light-transmissive electrode 142 is disposed to extend to the outside of the metal film 17 in a top view, and the p-pad electrode 15 formed within the region provided with the metal film 17 is electrically connected to the second light-transmissive electrode 142. With this arrangement, absorption of light by the p-pad electrode 15 can be reduced while securing the path of electric current.

For the p-pad electrode 15, for example, Cu, Au, or an alloy containing these metals as a main component can be used so that the p-side external connection portion 15a can be suitable for connection to the outside by wire bonding.

In the p-pad electrode 15, the p-side external connection portion 15a and the p-side extending portion 15b are made of the same material.

Protective Film

The protective film 18 is a film that has light transmissiveness and insulation properties, and covers approximately the entirety of an upper side of the light-emitting element 1. As shown in FIG. 1B, etc., the protective film 18 has an opening 18n above a portion of the upper surface of the n-side semiconductor layer 12n at the exposed portion 12b. The n-electrode 13 is disposed in the opening 18n. As shown in FIG. 1B, for example, the protective film 18 has an opening 18p above a portion of the region provided with the metal film 17. The p-pad electrode 15 is disposed in the opening 18p.

For the protective film 18, a material same as a material for the light-transmissive insulating film 16 described above can be used.

For example, $SiO_2$ can be used.

Operation of Light-Emitting Element

Next, operation of the light-emitting element 1 according to the embodiment will be described referring to FIG. 1A to FIG. 1D.

In the light-emitting element 1, when an external power supply is connected to the n-side external connection portion 13a and the p-side external connection portion 15a, electric current flows through the p-pad electrode 15, the second light-transmissive electrode 142, the first light-transmissive electrode 141, the p-side semiconductor layer 12p, the active layer 12a, the n-side semiconductor layer 12n, and the n-electrode 13 in this order, and the active layer 12a emits light.

Extraction of light traveling toward the upper surface side of the light-emitting element 1 will be described in detail.

Light propagating upward in the light-emitting element 1 is extracted to the outside through the first light-transmissive electrode 141 and the protective film 18. In the region provided with the light-transmissive insulating film 16, a portion of a light emitted from the active layer 12a is reflected by the interface between the light-transmissive insulating film 16 and the p-side semiconductor layer 12p and returns to the semiconductor layered body 12 side. Another portion of the light enters the light-transmissive insulating film 16, but a major portion of the light is reflected by the metal film 17 and returns to the semiconductor layered body 12 side.

Light incident on the region not provided with the metal film 17 is extracted to the outside through the first light-transmissive electrode 141 and the protective film 18, or through the first light-transmissive electrode 141, the second light-transmissive electrode 142, and the protective film 18.

The light having been returned to the semiconductor layered body 12 side propagates through the substrate 11 and the semiconductor layered body 12 and is extracted to the outside.

Method for Manufacturing Light-Emitting Element

Next, a method for manufacturing the light-emitting element 1 according to the first embodiment will be described.

Figure 3:
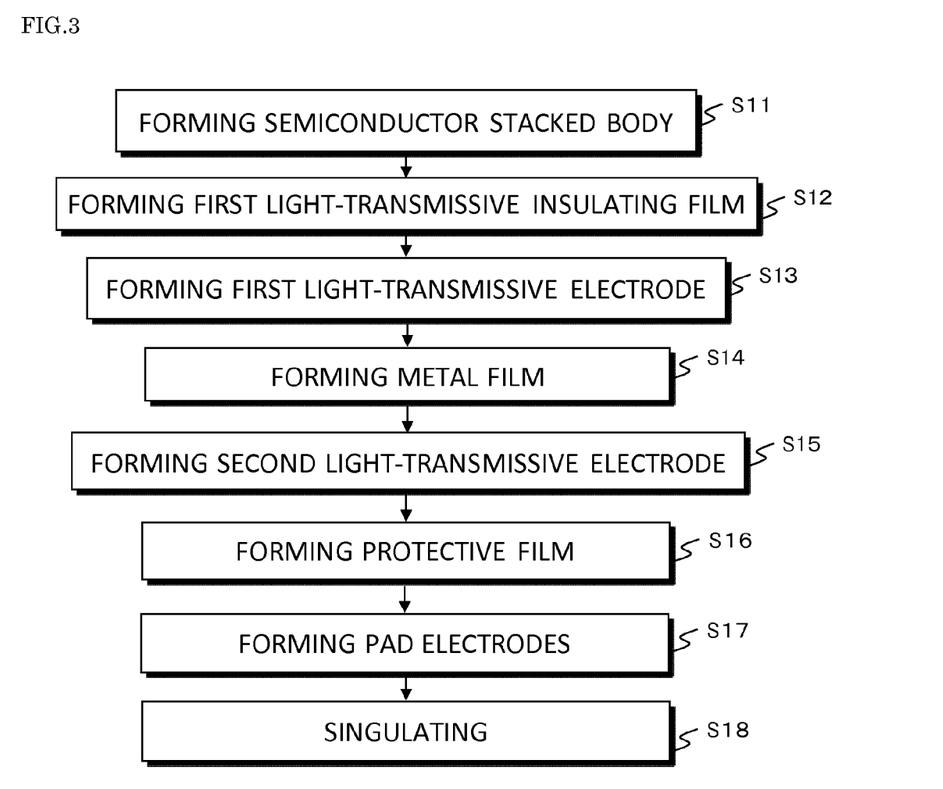
FIG. 3 is a schematic flowchart illustrating a method of manufacturing the semiconductor light-emitting element according to the first embodiment.

As shown in FIG. 3, the method of manufacturing the light-emitting element 1 includes step S11 of forming a semiconductor layered body, step S12 of forming a light-transmissive insulating film, step S13 of forming a first light-transmissive electrode, step S14 of forming a metal film, step S15 of forming a second light-transmissive electrode, step S16 of forming a protective film, step S17 of forming pad electrodes, and step S18 of singulating. The steps are performed in this order.

In the description below, each step is illustrated in detail referring to FIG. 4A to FIG. 4H (referring to FIG. 1A to FIG. 2A and FIG. 3 as appropriate). Each of FIG. 4A to FIG. 4H shows a cross-section at a position corresponding to the line IC-IC in FIG. 1A. Similarly to FIG. 1C as described above, illustration of a portion of the cross-section is omitted.

Each of the steps is performed in wafer-level process in which a plurality of light-emitting elements 1 are formed in the single substrate 11. That is, the light-emitting elements 1 are formed in a two-dimensional array on the substrate 11. In other words, in FIG. 4A to FIG. 4H, one light-emitting element 1 is formed in each region demarcated by imaginary demarcation lines BD.

Forming Semiconductor Layered body

Figure 4A:
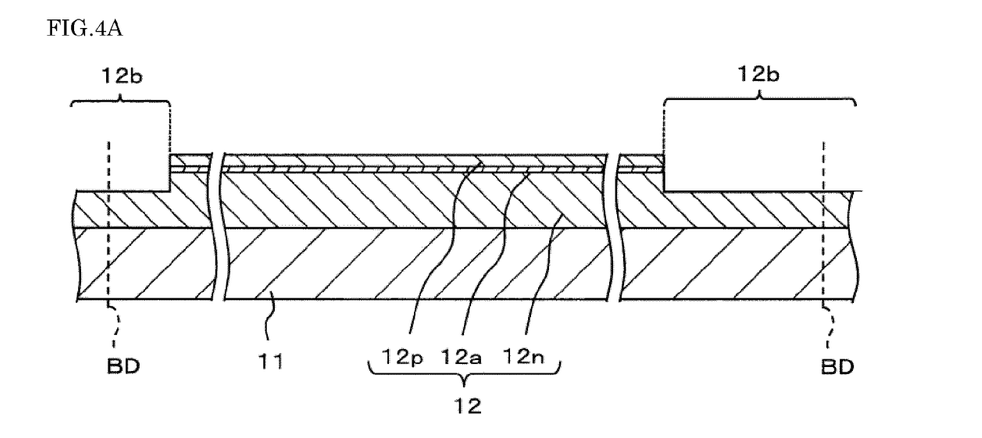
FIG. 4A is a schematic cross-sectional view illustrating a step of forming a semiconductor layered body in the method of manufacturing the light-emitting element according to the first embodiment.

First, in the step S11 of forming a semiconductor layered body, the semiconductor layered body 12 having the exposed portion 12b is formed, as shown in FIG. 4A. The semiconductor layered body 12 can be obtained by layering the n-side semiconductor layer 12n, the active layer 12a, and the p-side semiconductor layer 12p using a nitride semiconductor in the order on the upper surface of the substrate 11 made of sapphire by an MOCVD method or the like. Next, the exposed portion 12b, in which the n-side semiconductor layer 12n is exposed, can be formed by etching or the like, in a region for forming the n-electrode 13 and a border region (i.e., dicing street), which is a region disposed along the imaginary demarcation line BD between a plurality of light-emitting elements 1.

Forming Light-Transmissive Insulating Film

Figure 4B:
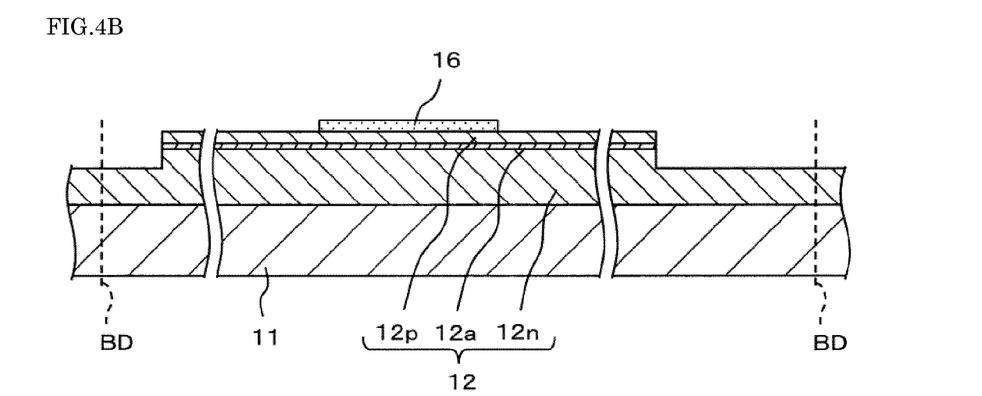
FIG. 4B is a schematic cross-sectional view illustrating a step of forming a light-transmissive insulating film in the method of manufacturing the light-emitting element according to the first embodiment.

Next, in the step S12 of forming a light-transmissive insulating film, the light-transmissive insulating film 16 is formed on a portion of the upper surface of the p-side semiconductor layer 12p (in the region where the p-pad electrode 15 is to be disposed and its adjacent region in a top view), as shown in FIG. 4B. The light-transmissive insulating film 16 can be formed, for example, by sputtering using a light-transmissive insulating material such as $SiO_2$.

Forming First Light-Transmissive Electrode

Figure 4C:
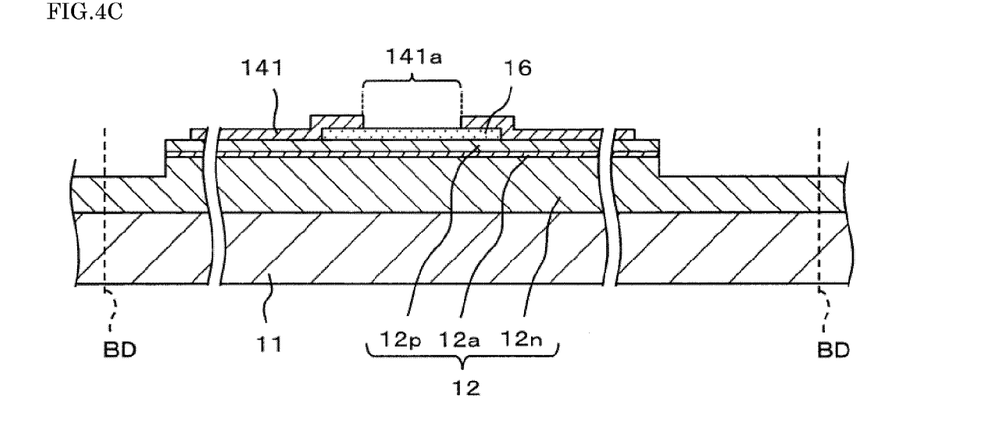
FIG. 4C is a schematic cross-sectional view illustrating a step of forming a first light-transmissive electrode in the method of manufacturing the light-emitting element according to the first embodiment.

Next, in the step S13 of forming a first light-transmissive electrode, the first light-transmissive electrode 141 is formed on a large part of a region in the upper surface of the p-side semiconductor layer 12p where the light-transmissive insulating film 16 is not formed and on the upper surface of the light-transmissive insulating film 16, as shown in FIG. 4C. The first light-transmissive electrode 141 has the opening 141a above the upper surface of the light-transmissive insulating film 16. The first light-transmissive electrode 141 can be formed, for example, by sputtering using a light-transmissive electrically-conductive material such as ITO.

Next, heat-treatment is performed so that the first light-transmissive electrode 141 will have ohmic contact with the p-side semiconductor layer 12p. With the heat-treatment, light-transmissivity of the first light-transmissive electrode 141 can be increased.

Forming Metal Film

Figure 4D:
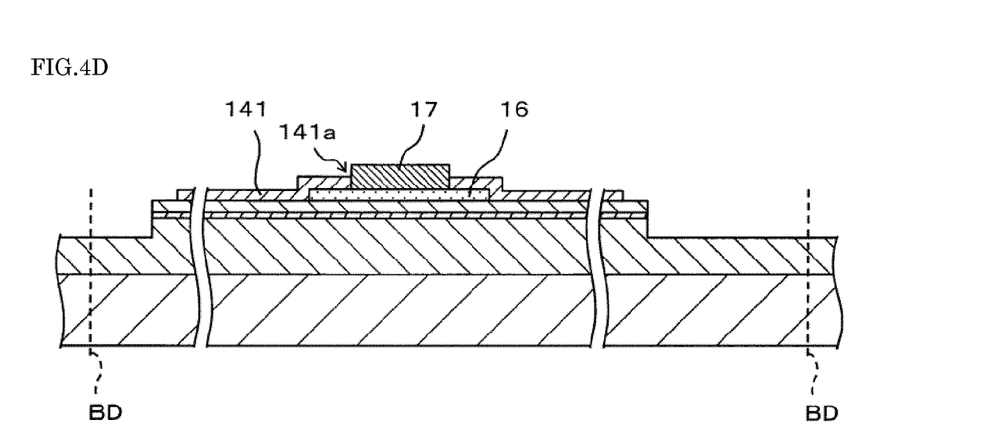
FIG. 4D is a schematic cross-sectional view illustrating a step of forming a metal film in the method of manufacturing the light-emitting element according to the first embodiment.

Next, at the step S14 of forming a metal film, the metal film 17 is formed in the opening 141a of the first light-transmissive electrode 141 above the upper surface of the light-transmissive insulating film 16, as shown in FIG. 4D. The metal film 17 can be formed, for example, by sputtering.

Forming Second Light-Transmissive Electrode

Figure 4E:
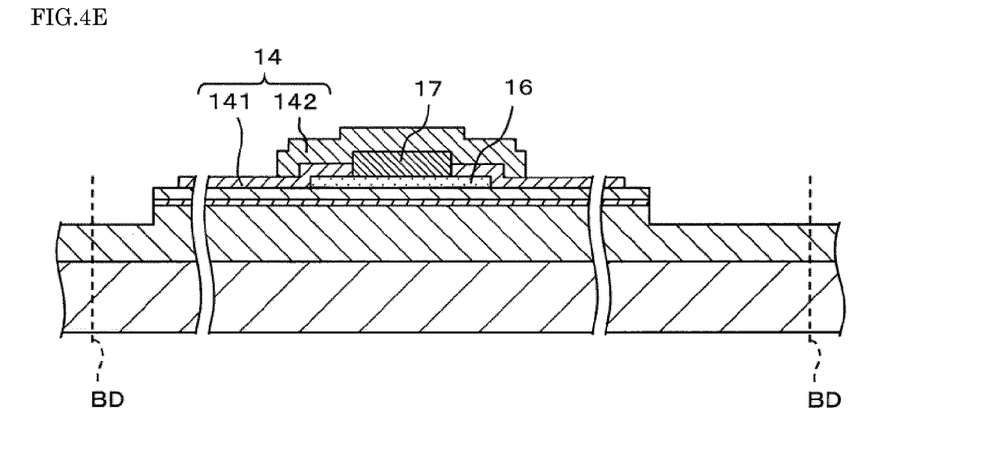
FIG. 4E is a schematic cross-sectional view illustrating a step of forming a second light-transmissive electrode in the method of manufacturing the light-emitting element according to the first embodiment.

Next, in the step S15 of forming a second light-transmissive electrode, the second light-transmissive electrode 142 is formed over the upper surface of the metal film 17 so that both end portions of the second light-transmissive electrode 142 is in contact with the upper surface of the first light-transmissive electrode 141, as shown in FIG. 4E. The second light-transmissive electrode 142 can be intermittently disposed along the extending direction of the p-side extending portion 15b of the p-pad electrode 15, that is, along the extending direction of the metal film 17. In this case, the second light-transmissive electrode 142 is intermittently formed in the region where the metal film 17 is disposed and its adjacent area in a top view.

The second light-transmissive electrode 142 can be formed using a light-transmissive electrically-conductive material such as ITO by sputtering or the like, as in the forming the first light-transmissive electrode 141.

For example, in the case where the second light-transmissive electrode 142 and the first light-transmissive electrode 141 are both formed of ITO, the second light-transmissive electrode 142 and the first light-transmissive electrode 141 can be electrically connected to each other by being formed to be contact with each other. Thus, heat-treatment of the second light-transmissive electrode 142 is not necessary. In other words, heat is not applied to the metal film 17 that has been formed in a previous step, degradation the metal film 17 is reduced, so that light reflectance can be maintained. In the above-described step of forming the first light-transmissive electrode 141, the heat-treatment for achieving ohmic contact between the first light-transmissive electrode 141 and the p-side semiconductor layer 12p is performed at a temperature, for example, in a range of about 450 to 550° C. However, heating at a temperature of about 400° C. or greater, allow metals such as Al and Ag, which may be used for the metal film 17, to be deteriorated, so that light-reflectance tends to be decreased.

Forming Protective Film

Figure 4F:
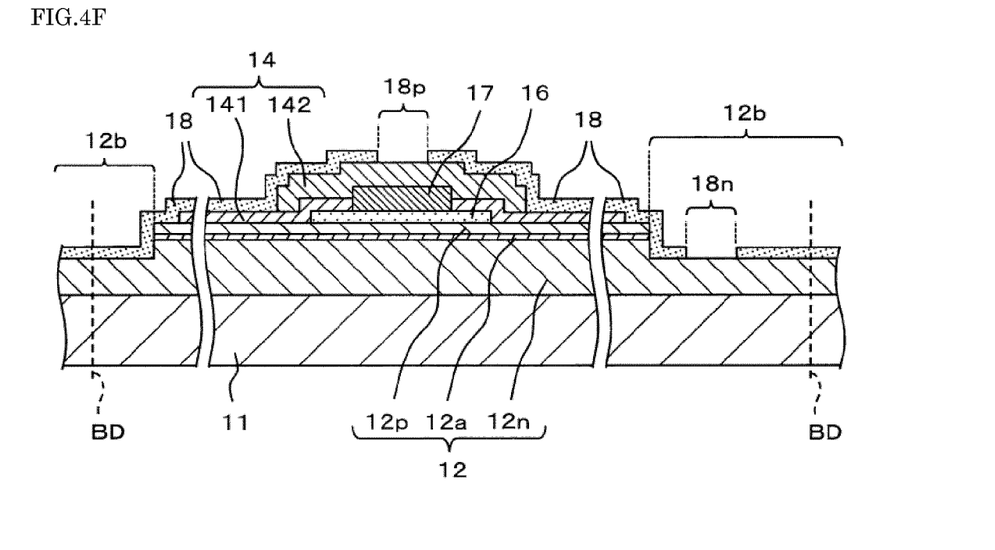
FIG. 4F is a schematic cross-sectional view illustrating a step of forming a protective film in the method of manufacturing the light-emitting element according to the first embodiment.

Next, in the step S16 of forming a protective film, the protective film 18 is formed on an upper side of the wafer except for the regions on which the n-electrode 13 and the p-pad electrode 15 are to be formed, as shown in FIG. 4F. The protective film 18 has the opening 18n in the region on which the n-electrode 13 is to be disposed, and has the opening 18p in the region on which the p-pad electrode 15 is to be disposed. The protective film 18 can be formed, for example, by sputtering using a light-transmissive insulating material such as $SiO_2$, as described above.

Forming Pad Electrodes

Figure 4G:
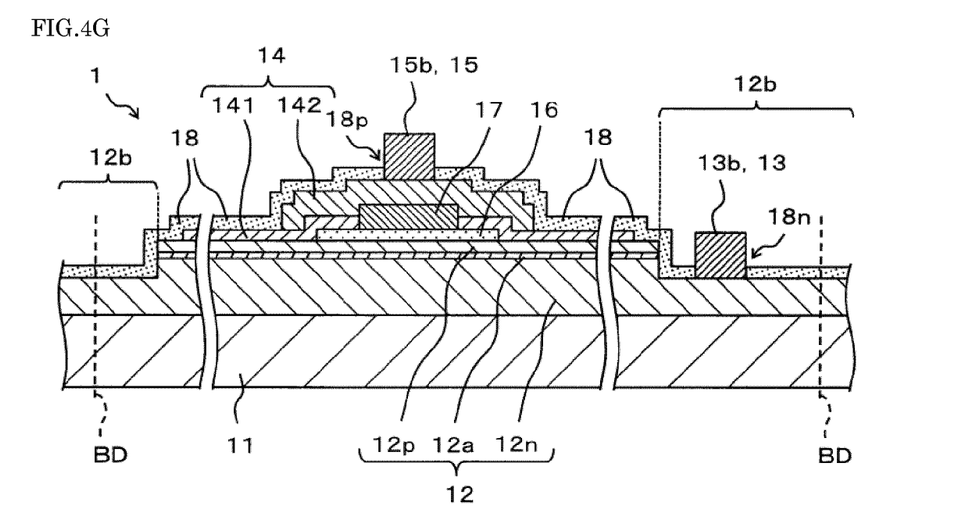
FIG. 4G is a schematic cross-sectional view illustrating a step of forming pad electrodes in the method of manufacturing the light-emitting element according to the first embodiment.

Next, in the step S17 of forming pad electrodes, the n-electrode 13 and the p-pad electrode 15, which are the pad electrodes of the light-emitting element 1, are formed in the openings 18n and 18p of the protective film 18, as shown in FIG. 4G.

The n-electrode 13 and the p-pad electrode 15 can be formed, for example, by sputtering or vapor deposition using a metal material such as Au. In this step, the n-electrode 13 and the p-pad electrode 15 can be patterned by a lift-off method using a resist pattern that has been formed in the previous step S16 of forming a protective film.

The order of the step S16 of forming a protective film and the step S17 of forming pad electrodes may be reversed.

Singulating

Figure 4H:
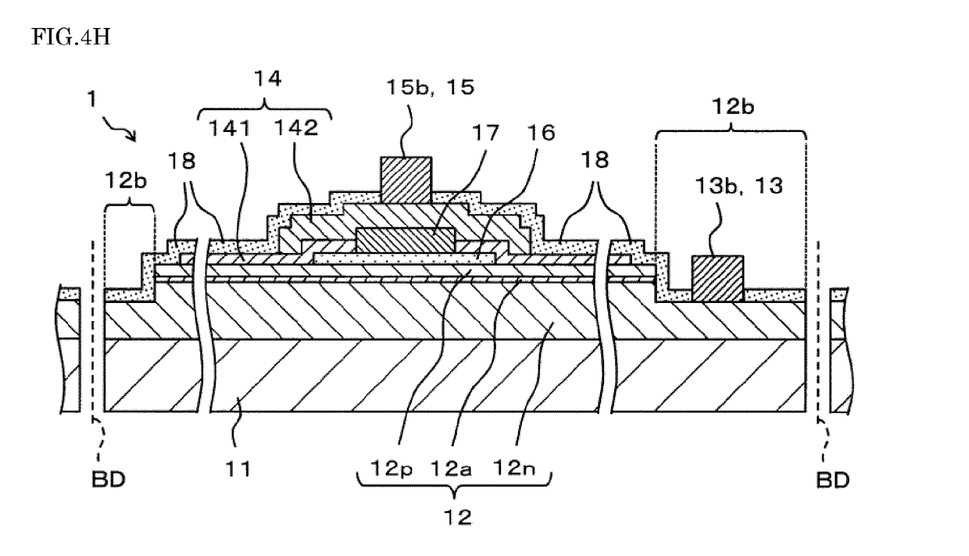
FIG. 4H is a schematic cross-sectional view illustrating a step of singulating in the method of manufacturing the light-emitting element according to the first embodiment.

Next, in the step S18 of singulating, cutting is performed along the imaginary demarcation lines BD set on the exposed portions 12b by dicing, scribing or the like to singulate the wafer into a plurality of light-emitting elements 1, as shown in FIG. 4H.

Before or after singulating the wafer, a reflective layer made of a metal film or a distributed Bragg reflector (DBR) film, for example, may be disposed on a lower surface side of the substrate 11. With this arrangement, light from the light-emitting element 1 advancing toward the lower side of the substrate 11 can be reflected to the upper surface side of the substrate 11, so that light extraction efficiency can be improved. Further, a fluorescent material layer may be disposed on a light extracting surface side of the light-emitting element 1 to extract combined light of light from the light-emitting element 1 and light from the fluorescent material layer.

The light-emitting element 1 can be manufactured through the above-described steps.

Second Embodiment

Figure 5:
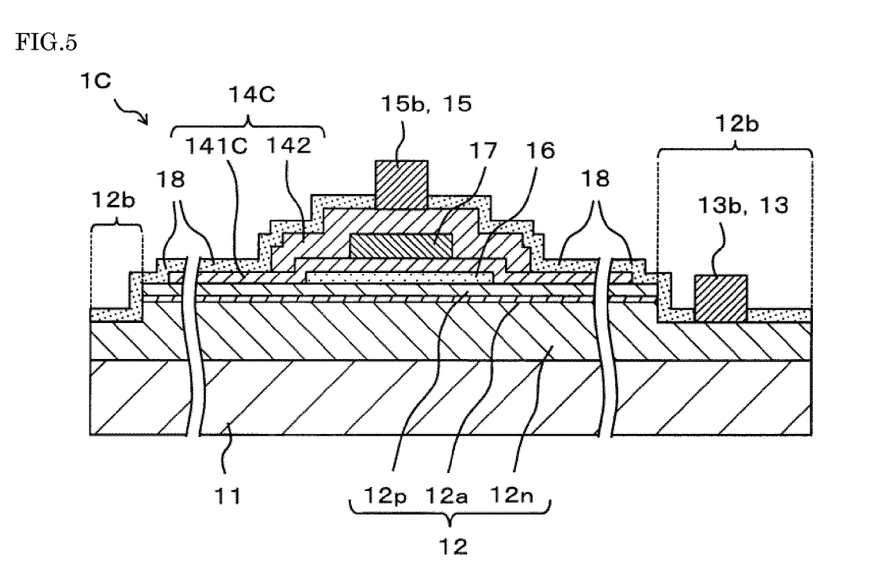
FIG. 5 is a schematic cross-sectional view illustrating a structure of a light-emitting element according to a second embodiment.

Next, a light-emitting element according to a second embodiment will be described referring to FIG. 5.

A light-emitting element 1C according to the second embodiment differs from the light-emitting element in the first embodiment in that a metal film 17 is disposed on an upper surface of a first light-transmissive electrode 141C without providing an opening of the first light-transmissive electrode 141C above the light-transmissive insulating film 16. Other configurations are similar to that in the first embodiment.

In order to increase light extraction efficiency, it is preferable that the first light-transmissive electrode 141 not be disposed on a lower surface side of the metal film 17, which is a light-reflective film, as in the light-emitting element 1. However, as in the light-emitting element 1C, the metal film 17 may be disposed on the first light-transmissive electrode 141C. With such a configuration, degradation or the like of the metal film 17 can be reduced as in the first embodiment.

As shown in the above, the light-emitting element and the method of manufacturing the same is illustrated in accordance with the embodiments for carrying out the present invention, but the scope of the present invention is not limited to the above descriptions and should be widely understood based on the scope of the claims. Further, based on the above descriptions it will be obvious that various changes and modifications can be made therein without departing from the scope of the present invention.

INDUSTRIAL APPLICABILITY

The light-emitting element in the present disclosure and a light-emitting element manufactured by the method for manufacturing the same can be used for various light sources such as light sources for backlighting liquid-crystal displays, various lighting apparatus, and large-size displays.

What is claimed is:

1. A method of manufacturing a light-emitting element, the method comprising:
    forming a light-transmissive insulating film on a portion of an upper surface of a semiconductor layered body;
    forming a first light-transmissive electrode to continuously cover the upper surface of the semiconductor layered body and an upper surface of the light-transmissive insulating film;
    heat-treating the first light-transmissive electrode, and subsequently forming a metal film above the light-transmissive insulating film;
    forming a second light-transmissive electrode to continuously cover an upper surface of the metal film and an upper surface of the first light-transmissive electrode, the second light-transmissive electrode being electrically connected to the first light-transmissive electrode; and
    forming a pad electrode above the metal film and in contact with an upper surface of the second light-transmissive electrode,
    wherein the second light-transmissive electrode includes first electrode sections spaced apart from each other, and
    wherein the first electrode sections are disposed on the metal film and the first light-transmissive electrode which is adjacent to the metal film.

2. The method of manufacturing a light-emitting element according to claim 1,
    wherein, in the step of forming the second light-transmissive electrode, the second light-transmissive electrode is formed to have a thickness larger than a thickness of the first light-transmissive electrode.

3. The method of manufacturing a light-emitting element according to claim 2,
    wherein, in the step of forming the pad electrode, the pad electrode is formed so as to comprise:
        an external connection portion configured to be electrically connected to an outside, and
        an extending portion extending from the external connection portion,
    wherein, in the step of forming the second light-transmissive electrode, the second light-transmissive electrode includes second electrode sections that are disposed on the metal film and formed along an extending direction of the extending portion, and
    wherein the second electrode sections are narrower than the first electrode sections, and respective second electrode sections extend between neighboring first electrode sections.

4. The method of manufacturing a light-emitting element according to claim 2,
    wherein, in the step of forming the first light-transmissive electrode, an opening is formed through the first light-transmissive electrode and above the light-transmissive insulating film, and
    wherein, in the step of forming the metal film, the metal film is disposed in the opening and in contact with the upper surface of the light-transmissive insulating film.

5. The method of manufacturing a light-emitting element according to claim 1,
    wherein, in the step of forming the pad electrode, the pad electrode is formed so as to comprise:
        an external connection portion configured to be electrically connected to an outside, and
        an extending portion extending from the external connection portion,
    wherein, in the step of forming the second light-transmissive electrode, the second light-transmissive electrode includes second electrode sections that are disposed on the metal film and formed along an extending direction of the extending portion, and
    wherein the second electrode sections are narrower than the first electrode sections, and respective second electrode sections extend between neighboring first electrode sections.

6. The method of manufacturing a light-emitting element according to claim 5,
    wherein, in the step of forming the first light-transmissive electrode, an opening is formed through the first light-transmissive electrode and above the light-transmissive insulating film, and
    wherein, in the step of forming the metal film, the metal film is disposed in the opening and in contact with the upper surface of the light-transmissive insulating film.

7. The method of manufacturing a light-emitting element according to claim 1,
    wherein, in the step of forming the first light-transmissive electrode, an opening is formed through the first light-transmissive electrode and above the light-transmissive insulating film, and
    wherein, in the step of forming the metal film, the metal film is disposed in the opening and in contact with the upper surface of the light-transmissive insulating film.

8. The method of manufacturing a light-emitting element according to claim 1, wherein the first light-transmissive electrode and the second light-transmissive electrode are each formed using a material containing a metal oxide selected from the group consisting of ITO and ZnO.

9. The method of manufacturing a light-emitting element according to claim 1,
wherein the metal film is formed using a material containing, as a main component, a metal selected from the group consisting of Al, Ru, Ag, Ti, Ni, and an alloy containing one or more of these metals.

10. A light-emitting element comprising:
a semiconductor layered body;
a light-transmissive insulating film on a portion of an upper surface of the semiconductor layered body;
a metal film in at least a portion of a region above the light-transmissive insulating film;
a first light-transmissive electrode continuously covering the upper surface of the semiconductor layered body and an upper surface of the light-transmissive insulating film;
a second light-transmissive electrode continuously covering an upper surface of the metal film and an upper surface of the first light-transmissive electrode and electrically connected to the first light-transmissive electrode; and
a pad electrode disposed above the metal film and in contact with an upper surface of the second light-transmissive electrode,
wherein the second light-transmissive electrode includes first electrode sections spaced apart from each other, and
wherein the first electrode sections are disposed on the metal film and the first light-transmissive electrode which is adjacent to the metal film.

11. The light-emitting element according to claim 10,
wherein the second light-transmissive electrode has a thickness larger than a thickness of the first light-transmissive electrode.

12. The light-emitting element according to claim 11,
wherein the first light-transmissive electrode has an opening above the light-transmissive insulating film, and
wherein the metal film is disposed in the opening and in contact with the upper surface of the light-transmissive insulating film.

13. The light-emitting element according to claim 10,
wherein the pad electrode comprises:
an external connection portion configured to be electrically connected to an outside; and
an extending portion extending from the external connection portion in an extending direction,
wherein the second light-transmissive electrode includes second electrode sections that are disposed on the metal film and along the extending direction of the extending portion, and
wherein the second electrode sections are narrower than the first electrode sections, and respective second electrode sections extend between neighboring first electrode sections.

14. The light-emitting element according to claim 10,
wherein the first light-transmissive electrode has an opening above the light-transmissive insulating film, and
wherein the metal film is disposed in the opening and in contact with the upper surface of the light-transmissive insulating film.

15. The light-emitting element according to claim 10,
wherein the first light-transmissive electrode and the second light-transmissive electrode contains a metal oxide selected from the group consisting of ITO and ZnO.

16. The light-emitting element according to claim 10,
wherein the metal film contains, as a main component, a metal selected from the group consisting of Al, Ru, Ag, Ti, Ni, and an alloy containing one or more of these metals.

17. A method of manufacturing a light-emitting element, the method comprising:
forming a light-transmissive insulating film on a portion of an upper surface of a semiconductor layered body;
forming a first light-transmissive electrode to continuously cover the upper surface of the semiconductor layered body and an upper surface of the light-transmissive insulating film;
forming an opening through the first light-transmissive electrode and above the light-transmissive insulating film;
heat-treating the first light-transmissive electrode, and subsequently forming a metal film on the light-transmissive insulating film, the metal film being disposed in the opening and in contact with the upper surface of the light-transmissive insulating film;
forming a second light-transmissive electrode to continuously cover an upper surface of the metal film and an upper surface of the first light-transmissive electrode, the second light-transmissive electrode being electrically connected to the first light-transmissive electrode; and
forming a pad electrode above the metal film and in contact with an upper surface of the second light-transmissive electrode.

18. The method of manufacturing a light-emitting element according to claim 17,
wherein, in the step of forming the second light-transmissive electrode, the second light-transmissive electrode is formed to have a thickness larger than a thickness of the first light-transmissive electrode.

19. The method for manufacturing a light-emitting element according to claim 17,
wherein the first light-transmissive electrode and the second light-transmissive electrode are each formed using a material containing a metal oxide selected from the group consisting of ITO and ZnO.

20. The method for manufacturing a light-emitting element according to claim 17,
wherein the metal film is formed using a material containing, as a main component, a metal selected from the group consisting of Al, Ru, Ag, Ti, Ni, and an alloy containing one or more of these metals.

21. A light-emitting element comprising:
a semiconductor layered body;
a light-transmissive insulating film on a portion of an upper surface of the semiconductor layered body;
a first light-transmissive electrode continuously covering the upper surface of the semiconductor layered body and an upper surface of the light-transmissive insulating film, the first light-transmissive electrode having an opening above the light-transmissive insulating film;
a metal film on the light-transmissive insulating film, the metal film being disposed in the opening and in contact with the upper surface of the light-transmissive insulating film;

a second light-transmissive electrode continuously covering an upper surface of the metal film and an upper surface of the first light-transmissive electrode and electrically connected to the first light-transmissive electrode; and a pad electrode disposed above the metal film and in contact with an upper surface of the second light-transmissive electrode.

22. The light-emitting element according to claim 21, wherein the second light-transmissive electrode has a thickness larger than a thickness of the first light-transmissive electrode.

23. The light-emitting element according to claim 21, wherein the first light-transmissive electrode and the second light-transmissive electrode contains a metal oxide selected from the group consisting of ITO and ZnO.

24. The light-emitting element according to claim 21, wherein the metal film contains, as a main component, a metal selected from the group consisting of Al, Ru, Ag, Ti, Ni, and an alloy containing one or more of these metals.

* * * * *